US008421212B2

(12) United States Patent
Chen et al.

(10) Patent No.: US 8,421,212 B2
(45) Date of Patent: Apr. 16, 2013

(54) INTEGRATED CIRCUIT PACKAGING SYSTEM WITH ACTIVE SURFACE HEAT REMOVAL AND METHOD OF MANUFACTURE THEREOF

(75) Inventors: Kang Chen, Singapore (SG); Xusheng Bao, Singapore (SG); Rui Huang, Singapore (SG); Yung Kuan Hsiao, Singapore (SG); Hin Hwa Goh, Singapore (SG)

(73) Assignee: Stats Chippac Ltd., Singapore (SG)

( * ) Notice: Subject to any disclaimer, the term of this patent is extended or adjusted under 35 U.S.C. 154(b) by 274 days.

(21) Appl. No.: 12/887,681

(22) Filed: Sep. 22, 2010

(65) Prior Publication Data

US 2012/0068328 A1 Mar. 22, 2012

(51) Int. Cl.
*H01L 23/48* (2006.01)

(52) U.S. Cl.
USPC ...................... 257/693; 257/E23.08; 438/122

(58) Field of Classification Search .................. 438/122; 257/693, E23.08
See application file for complete search history.

(56) References Cited

U.S. PATENT DOCUMENTS 5,250,843 A 10/1993 Eichelberger
5,353,498 A 10/1994 Fillion et al.
5,834,839 A 11/1998 Mertol
5,841,193 A 11/1998 Eichelberger
5,977,626 A 11/1999 Wang et al.
6,555,906 B2 4/2003 Towle et al.
6,841,413 B2 1/2005 Liu et al.
7,435,910 B2 10/2008 Sakamoto et al.
7,619,304 B2 11/2009 Bauer et al.
7,619,901 B2 11/2009 Eichelberger et al.
2011/0031634 A1* 2/2011 Pagaila ........................ 257/777

* cited by examiner

*Primary Examiner* — Phuc Dang
(74) *Attorney, Agent, or Firm* — Ishimaru & Associates LLP

(57) ABSTRACT

A method of manufacture of an integrated circuit packaging system includes: providing an interconnect structure having a structure bottom side, a structure top side, and a cavity, the structure bottom side electrically connected to the structure top side; mounting an integrated circuit entirely within the cavity, the integrated circuit having an active side coplanar with the structure top side; forming an encapsulation partially covering the interconnect structure and the integrated circuit, the encapsulation having an encapsulation top side coplanar with the structure top side and the active side; forming a top re-passivation layer over the structure top side and the encapsulation; and mounting a heat sink over the top re-passivation layer for removing heat from the active side.

18 Claims, 5 Drawing Sheets

INTEGRATED CIRCUIT PACKAGING SYSTEM WITH ACTIVE SURFACE HEAT REMOVAL AND METHOD OF MANUFACTURE THEREOF

TECHNICAL FIELD

The present invention relates generally to an integrated circuit packaging system, and more particularly to a system for heat removal.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

As the integrated circuit technology advances, more circuit cells can be fabricated in a similar die area so that substantially increased functionality can be accomplished on a given integrated circuit die. The added functionality and increase in the number of circuits generally involves a larger amount of power dissipation. The heat is transmitted from one integrated circuit to the other and there is no significant dissipation path other than through the solder ball to the motherboard. The increased heat in the package can significantly reduce the life of the integrated circuits in the package.

Thus, a need still remains for an integrated circuit packaging system providing low cost manufacturing and improved reliability. In view of the ever-increasing need to save costs and improve efficiencies, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an interconnect structure having a structure bottom side, a structure top side, and a cavity, the structure bottom side electrically connected to the structure top side; mounting an integrated circuit entirely within the cavity, the integrated circuit having an active side coplanar with the structure top side; forming an encapsulation partially covering the interconnect structure and the integrated circuit, the encapsulation having an encapsulation top side coplanar with the structure top side and the active side; forming a top re-passivation layer over the structure top side and the encapsulation; and mounting a heat sink over the top re-passivation layer for removing heat from the active side.

The present invention provides an integrated circuit packaging system, including: an interconnect structure having a structure bottom side, a structure top side, and a cavity, the structure bottom side electrically connected to the structure top side; an integrated circuit entirely within the cavity, the integrated circuit having an active side coplanar with the structure top side; an encapsulation partially covering the interconnect structure and the integrated circuit, the encapsulation having an encapsulation top side coplanar with the structure top side and the active side; a top re-passivation layer over the structure top side and the encapsulation; and a heat sink over the top re-passivation layer for removing heat from the active side.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
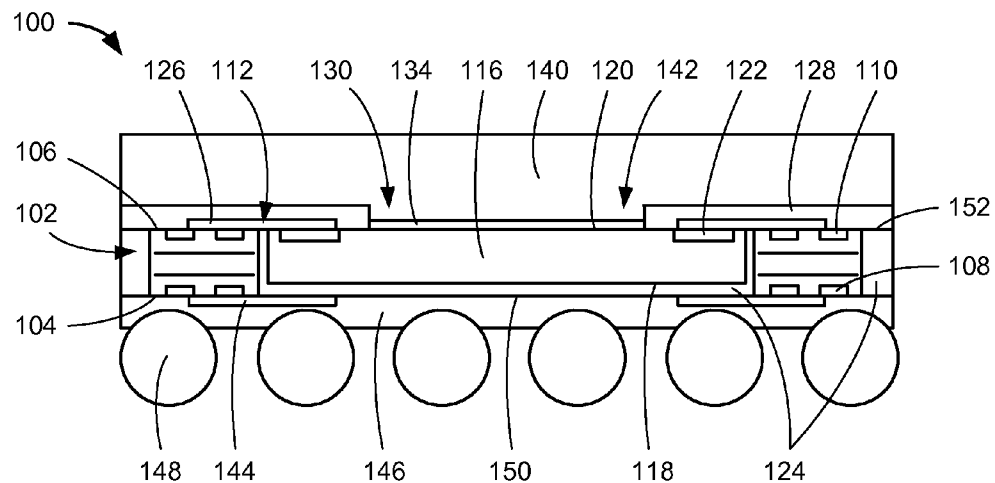
FIG. 1 is a cross-sectional view of an integrated circuit packaging system along a section line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

As numbers of inputs/outputs (I/Os) and functionality in integrated circuit components increase, density of power consumption of the integrated circuit components in a semiconductor die has increased. As a result, an average junction temperature of semiconductor dies increases. If the average junction temperature of the semiconductor dies becomes too high, integrated circuits of the semiconductor dies can be damaged or destroyed. The present invention provides a solution to solve the problem of an increase of the average junction temperature.

In a conventional fan-out wafer level chip scale packaging (FoWLCSP), in order to ensure direct mounting of packages on a motherboard, large solder balls with 0.4 millimeters (mm) to 0.6 millimeters (mm) must be used. Therefore, a number of solder balls directly contacted with a die active side is very limited. Based on Fourier's Law, the present invention provides better thermal performance with a larger heat dissipating area for heat removal as compared to the conventional FoWLCSP with a few solder balls.

Figure 2:
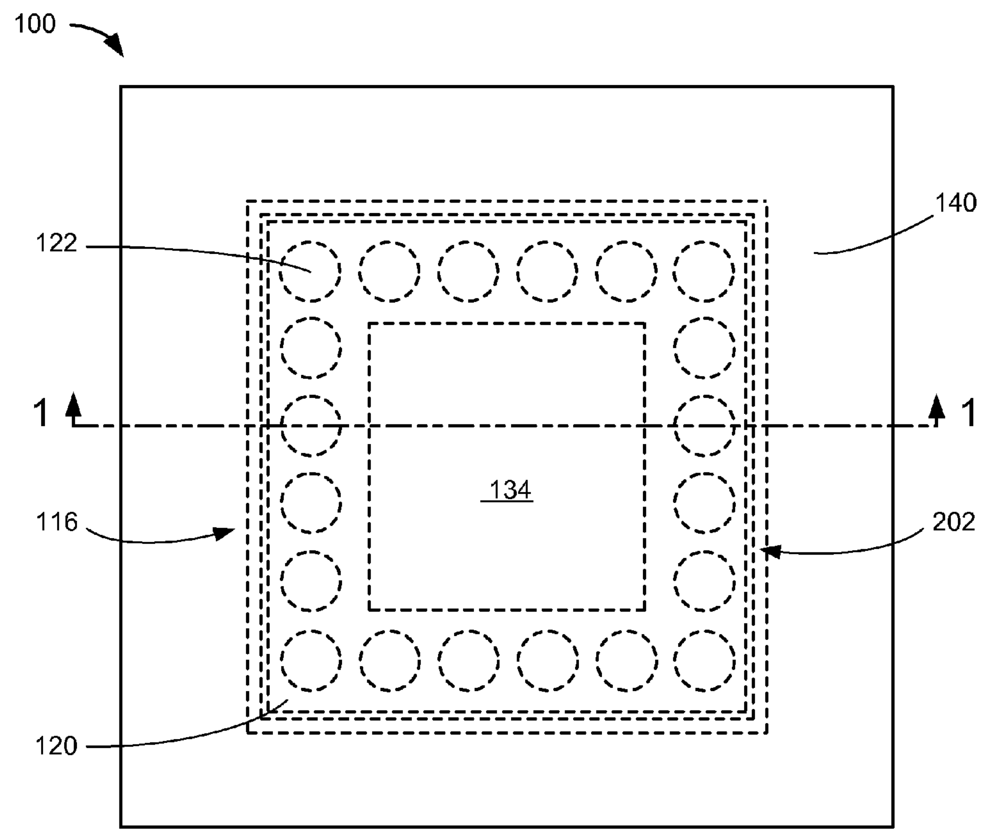
FIG. 2 is a top plan view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can include an interconnect structure 102, which provides a structure for connecting and mounting an electrical device therein. For example, the interconnect structure 102 can include a structure including a printed circuit board (PCB) or a silicon interposer with through silicon vertical insertion area (TSV).

The interconnect structure 102 can include a structure bottom side 104 and a structure top side 106 opposing the structure bottom side 104. A top surface of the interconnect structure 102 defines a plane of the structure top side 106. Similarly, a bottom surface of the interconnect structure 102 defines a plane of the structure bottom side 104.

The interconnect structure 102 can include a structure bottom pad 108 and a structure top pad 110 at the structure bottom side 104 and the structure top side 106, respectively. The structure bottom pad 108 and the structure top pad 110 are contact pads that provide electrical connectivity.

The interconnect structure 102 can include vias, traces, or a combination thereof that are electrically connected. The interconnect structure 102 can be electrically connected between the structure bottom side 104 and the structure top side 106. The structure bottom pad 108 and the structure top pad 110 can be electrically connected.

The interconnect structure 102 can include a cavity 112. The cavity 112 can be formed through a plane of the structure bottom side 104 and a plane of the structure top side 106 in central portions of the sides of the interconnect structure 102. An integrated circuit 116 can be mounted entirely within the cavity 112. The integrated circuit 116 is an electrical device including a flip chip, a semiconductor die, an integrated circuit die, or an embedded die.

In an alternative embodiment, the interconnect structure 102 can include a number of segments, which are parts or pieces of the interconnect structure 102. The segments can be separate from each other or formed as a single integral structure. For example, the interconnect structure 102 can be formed with only two separate pieces that are placed side-by-side with or adjacent the integrated circuit 116 and placed at opposite sides of the integrated circuit 116.

The interconnect structure 102 can include an open structure that does not enclose the integrated circuit 116. In other words, the interconnect structure 102 can be formed only adjacent some and not all of the sides of the integrated circuit 116. With the open structure, the interconnect structure 102 can include the cavity 112 having an open end.

The integrated circuit 116 can include an inactive side 118 and an active side 120 opposing the inactive side 118. The active side 120 refers to a side of the integrated circuit 116 having active circuitry fabricated thereon or having elements for connection to the active circuitry within the integrated circuit 116. For example, the active side 120 can be an active surface of the integrated circuit 116.

Heat dissipation can occur from the active side 120 of the integrated circuit 116. The integrated circuit 116 can include a device pad 122, which is a contact pad that provides electrical connectivity, at the active side 120.

The integrated circuit packaging system 100 can include an encapsulation 124, which covers a semiconductor package to seal electrical devices providing mechanical and environmental protection. The encapsulation 124 can be a cover including an encapsulant, a mold material, or a mold compound.

The encapsulation 124 can partially cover the interconnect structure 102 and the integrated circuit 116. The encapsulation 124 can be formed surrounding an external non-horizontal surface of the interconnect structure 102. The encapsulation 124 can be formed within the cavity 112 and surrounding the inactive side 118 and non-horizontal sides of the integrated circuit 116.

The interconnect structure 102 and the integrated circuit 116 can be embedded in the encapsulation 124. The structure bottom pad 108, the structure top pad 110, and the device pad 122 can be exposed from the encapsulation 124.

A top redistribution line 126 (RDL) can be formed directly on the active side 120. The top redistribution line 126 electrically connects the structure top pad 110 at the structure top side 106 and the device pad 122. The top redistribution line 126 can route electrical connection between the device pad 122 and the structure top pad 110.

A top re-passivation layer 128 can be formed on the structure top side 106, the encapsulation 124, a portion of the active side 120, and the top redistribution line 126. The top re-passivation layer 128 protects the structure top side 106, the portion of the active side 120, and the top redistribution line 126 from contamination. The top re-passivation layer 128 also electrically insulates the structure top side 106, the encapsulation 124, the portion of the active side 120, and the top redistribution line 126.

The interconnect structure 102 and the integrated circuit 116 can include passivation layers (not shown for simplicity purposes) deposited at the structure bottom side 104, the structure top side 106, the active side 120, or a combination thereof. The bottom redistribution line 144 can be formed on a passivation layer of the interconnect structure 102 at the structure bottom side 104. The top redistribution line 126 can be formed on a passivation layer of the interconnect structure 102 at the structure top side 106, on a passivation layer of the integrated circuit 116 at the active side 120, or a combination thereof. The term “re-passivation” means an additional passivation layer formed over the top redistribution line 126 or the bottom redistribution line 144 besides the passivation layers previously described.

The top re-passivation layer 128 can include a hole 130 over an interior portion of the active side 120. The hole 130 is formed through a plane of a bottom side of the top re-passivation layer 128 and a plane of a top side of the top re-passivation layer 128 in central portions of the sides of the top re-passivation layer 128. A thermal interface 134 can be formed within the hole 130. The thermal interface 134 is a thermal conductive layer that provides heat transfer.

The thermal interface 134 can be formed over the active side 120. The thermal interface 134 can be directly on the interior portion of the active side 120. A heat sink 140 can be mounted over the top re-passivation layer 128 and the thermal interface 134. The heat sink 140, such as a heat spreader, is a component or an assembly that transfers heat generated from the active side 120 of the integrated circuit 116. For illustrative purposes, the heat sink 140 can be connected to the integrated circuit 116 with the thermal interface 134, although it is understood that the heat sink 140 can be connected directly on the integrated circuit 116.

The heat sink 140 can have a surface area that is larger than a surface area of the active side 120 of the integrated circuit 116. The heat sink 140 can have a length that is greater than a length of the integrated circuit 116. The heat sink 140 can be over the active side 120. The heat sink 140 can remove a significant amount of heat from the active side 120 of the integrated circuit 116 because a majority of heat is generated at the active side 120.

The heat sink 140 can include a protrusion 142 directly on the thermal interface 134 with the thermal interface 134 directly on the interior portion of the active side 120 and within the hole 130. The interior portion of the active side 120, directly on which the thermal interface 134 is attached, can provide a significant heat dissipation area in relation to a surface area of the active side 120.

A bottom redistribution line 144 (RDL) can be formed directly on the structure bottom side 104. The bottom redistribution line 144 electrically connects the structure bottom pad 108 at the structure bottom side 104 to provide connectivity to an electrical connector. The bottom redistribution line 144 can route electrical connection between the electrical connector and the structure bottom pad 108.

A bottom re-passivation layer 146 can be formed on the structure bottom side 104, the encapsulation 124, and the bottom redistribution line 144. The bottom re-passivation layer 146 protects the structure bottom side 104 and the bottom redistribution line 144 from contamination. The bottom re-passivation layer 146 also electrically insulates the structure bottom side 104, the encapsulation 124, and the bottom redistribution line 144.

An external connector 148 can be attached to the bottom redistribution line 144. The external connector 148 is an electrical connector that provides electrical connectivity between the bottom redistribution line 144 and external systems. The external connector 148 can be connected to the bottom redistribution line 144 with an under bump metallurgy (UBM) (not shown). The bottom redistribution line 144 can electrically connect the structure bottom pad 108 and the external connector 148.

The external connector 148 can be formed with a conductive material including solder, a metal, or a metallic alloy. For example, the external connector 148 can be a solder ball. For illustrative purposes, the external connector 148 is shown as a conductive ball, although it is understood that the external connector 148 can be any other electrical connector.

As previously described, the structure bottom pad 108 and the structure top pad 110 can be electrically connected, and the bottom redistribution line 144 can electrically connect the structure bottom pad 108 and the external connector 148. To prevent the heat sink 140 from becoming a floating plane, the heat sink 140 can be grounded through the external connector 148. The heat sink 140 can be grounded by electrically connecting a conductive connector including a solder bump to the heat sink 140 and the structure top pad 110 and electrically connecting the external connector 148 to an external ground. The conductive connector can be formed through the top re-passivation layer 128.

The plane of the structure bottom side 104 can be coplanar with a plane of an encapsulation bottom side 150 of the encapsulation 124. A plane of an encapsulation top side 152 of the encapsulation 124 and planes of the structure top side 106 and the active side 120 can be coplanar with each other. The plane of the encapsulation top side 152 and planes of the structure top pad 110 can be coplanar with each other.

It has been discovered that the heat sink 140 connected to the active side 120 of the integrated circuit 116 with the thermal interface 134 significantly improves thermal properties including removing heat of the integrated circuit packaging system 100.

Further, it has been discovered that the heat sink 140 directly contacting the active side 120 produces a significantly shorter heat dissipation path as compared to other packages.

It has been unexpectedly observed that a significantly higher efficiency of heat dissipation is achieved with the heat sink 140 attached directly on the thermal interface 134 within the hole 130 due to a significantly larger heat dissipation area in relation to die size as compared to other packages.

Referring now to FIG. 2, therein is shown a top plan view of the integrated circuit packaging system 100. The top plan view depicts the active side 120, shown as a dash square, with the device pad 122, shown as a dash circle.

The device pad 122 can be formed in a peripheral array along a periphery of the active side 120. For illustrative purposes, the device pad 122 is shown as a circle, although it is understood that the device pad 122 can have any shape including a square, a rectangle, or a circle.

The thermal interface 134, shown as a dash square, can have an interface surface area smaller than a die surface area of the active side 120. The interface surface area can be a contact area that is connected to the heat sink 140. The heat sink 140 can have a surface area larger than a surface area of the active side 120.

The interface surface area can be a sufficient area that can be used to dissipate heat from the active side 120 to the heat sink 140. For example, the interface surface area can be approximately 35.856 square millimeters (mm2), which is up to approximately 78.2% of a total die area of approximately 45.854 square millimeters (mm2) at the active side 120.

The integrated circuit 116 can include a ring 202, shown as a dash square, between the device pad 122 and a periphery of the integrated circuit 116. The ring 202 prevents crack propagation during dicing. The ring 202 can be formed with a conductive material including a metallic material. The ring 202 can be formed adjacent and within the periphery of the integrated circuit 116. For example, the ring 202 can include a seal ring.

Figure 3:
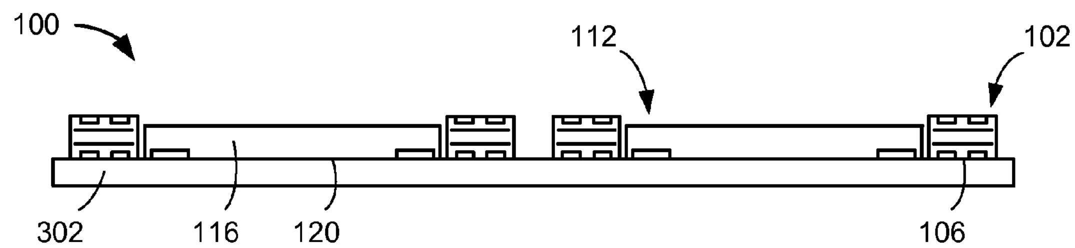
FIG. 3 is a cross-sectional view of a portion of the integrated circuit packaging system along the section line 1-1 of FIG. 2 in a device attachment phase of manufacture.

Referring now to FIG. 3, therein is shown a cross-sectional view of a portion of the integrated circuit packaging system 100 along the section line 1-1 of FIG. 2 in a device attachment phase of manufacture. The device attachment phase can include a temporary carrier 302, which provides a support structure for mounting the interconnect structure 102 and the integrated circuit 116 directly thereon. The device attachment phase can include a number of the interconnect structure 102 and the integrated circuit 116 mounted directly on the temporary carrier 302.

The structure top side 106 can be attached directly on the temporary carrier 302. The integrated circuit 116 can be mounted entirely within the cavity 112 with the active side 120 attached directly on the temporary carrier 302.

Figure 4:
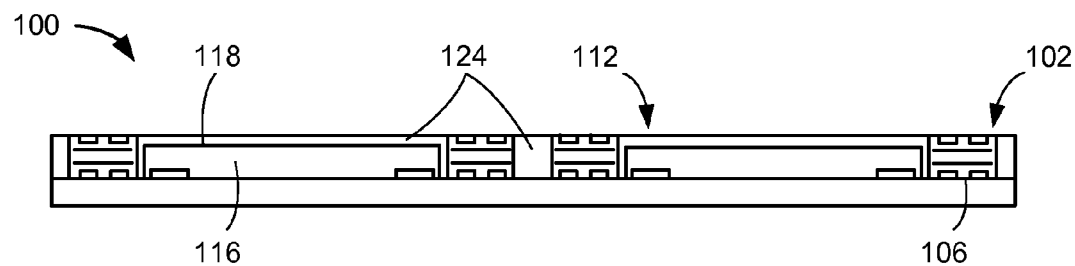
FIG. 4 is the structure of FIG. 3 in an encapsulation phase.

Referring now to FIG. 4, therein is shown the structure of FIG. 3 in an encapsulation phase. The encapsulation 124 can be formed partially covering the interconnect structure 102 and the integrated circuit 116. The encapsulation 124 can surround the external non-horizontal surface of the interconnect structure 102. The encapsulation 124 can be formed within the cavity 112 and surrounding the inactive side 118 and the non-horizontal sides of the integrated circuit 116.

Figure 5:
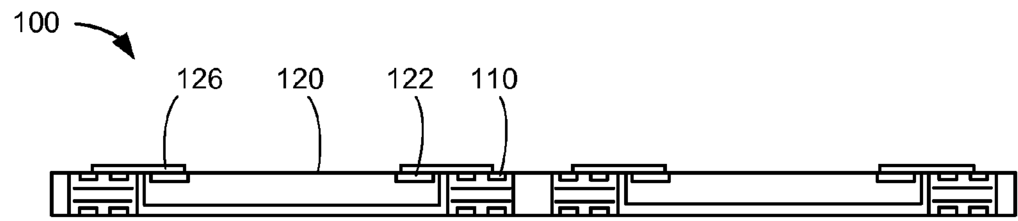
FIG. 5 is the structure of FIG. 4 in a redistribution line deposition phase.

Referring now to FIG. 5, therein is shown the structure of FIG. 4 in a redistribution line deposition phase. The redistribution line deposition phase is shown with the structure of FIG. 4 inverted and with the temporary carrier 302 of FIG. 3 removed. The top redistribution line 126 can be deposited directly on the active side 120. The top redistribution line 126 can electrically connect the structure top pad 110 and the device pad 122.

Figure 6:
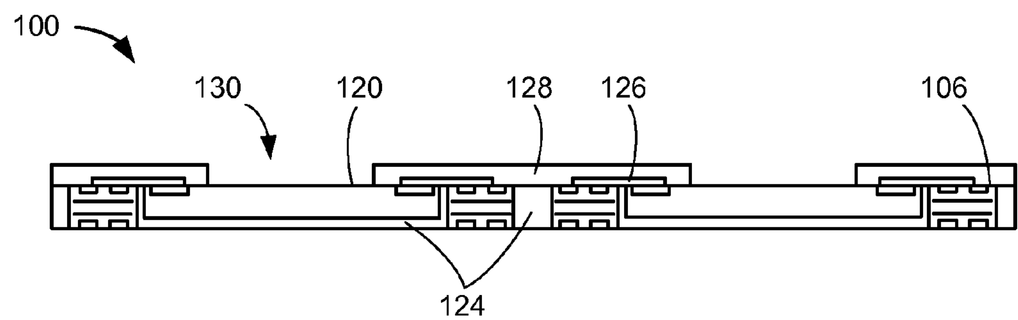
FIG. 6 is the structure of FIG. 5 in a re-passivation layer deposition phase.

Referring now to FIG. 6, therein is shown the structure of FIG. 5 in a re-passivation layer deposition phase. The top re-passivation layer 128 can be deposited on the structure top side 106, the encapsulation 124, a portion of the active side 120, and the top redistribution line 126.

The top re-passivation layer 128 can include the hole 130 formed over an interior portion of the active side 120. For example, the interior portion can be a portion at a center of the active side 120.

Figure 7:
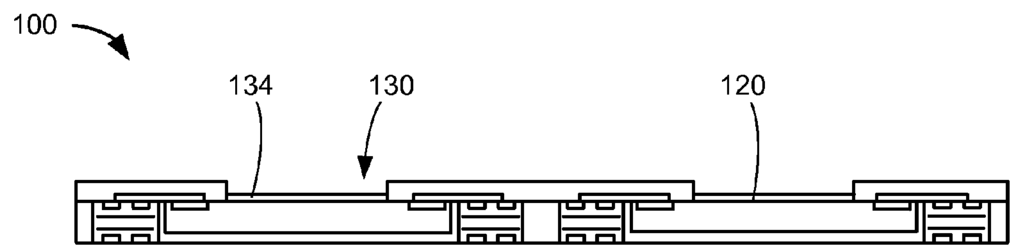
FIG. 7 is the structure of FIG. 6 in a thermal interface application phase.

Referring now to FIG. 7, therein is shown the structure of FIG. 6 in a thermal interface application phase. The thermal interface 134 can be deposited within the hole 130. The thermal interface 134 can be formed over the interior portion of the active side 120. For example, the thermal interface 134 can include a thermally conductive layer including a thermal interface material (TIM).

Figure 8:
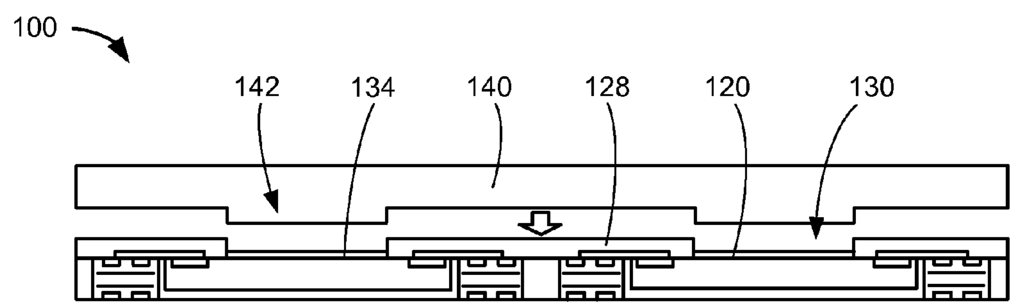
FIG. 8 is the structure of FIG. 7 in a heat sink attachment phase.

Referring now to FIG. 8, therein is shown the structure of FIG. 7 in a heat sink attachment phase. The heat sink 140 can be mounted over the top re-passivation layer 128 and the thermal interface 134. As shown with an arrow, the heat sink 140 is shown in a process of being mounted.

The heat sink 140 can be attached over the active side 120 with the thermal interface 134 between the heat sink 140 and the active side 120. The heat sink 140 can include the protrusion 142 directly on the thermal interface 134 with the thermal interface 134 directly on the interior portion of the active side 120 and within the hole 130.

Figure 9:
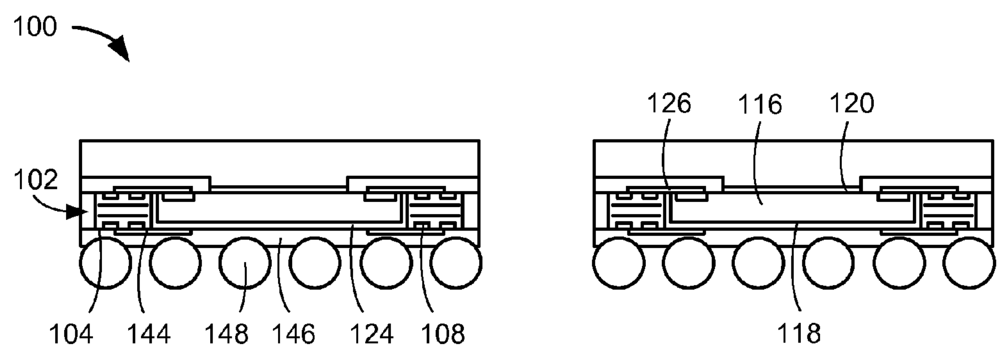
FIG. 9 is the singulated structure of FIG. 8 in an external connector attachment phase.

Referring now to FIG. 9, therein is shown the singulated structure of FIG. 8 in an external connector attachment phase. The bottom redistribution line 144 can be formed directly on the structure bottom side 104. For example, the bottom redistribution line 144 can be formed by building up a routing circuit directly on the structure bottom side 104.

The bottom re-passivation layer 146 can be deposited on the structure bottom side 104, the encapsulation 124, and the bottom redistribution line 144. The bottom re-passivation layer 146 can include a hole exposing a portion of the bottom redistribution line 144. The bottom redistribution line 144 can be attached to the external connector 148 within the hole.

The external connector 148 can be electrically connected to the bottom redistribution line 144. The external connector 148 can provide electrical connectivity between the bottom redistribution line 144 and external systems.

For example, the external connector 148 can be formed in an array including a full array, an area array, or a peripheral array. Also for example, the external connector 148 can include a conductive material including solder, a metal, or a metallic alloy. Further, for example, the external connector 148 can be a conductive connector including a solder ball.

The bottom redistribution line 144 can electrically connect the structure bottom pad 108 at the structure bottom side 104 and the external connector 148. The bottom redistribution line 144 can re-route an electrical connection between the structure bottom pad 108 and the external connector 148.

Electrical signals can be connected to the external connector 148, which can be formed adjacent the inactive side 118 opposite to the active side 120 of the integrated circuit 116. The electrical signals can be connected to the external connector 148 by the interconnect structure 102, the top redistribution line 126, and the bottom redistribution line 144.

Package singulation can be performed to complete a package assembly of the integrated circuit packaging system 100. Singulation can include a process including a mechanical or optical procedure that can be used to produce individual package units of the integrated circuit packaging system 100.

Figure 10:
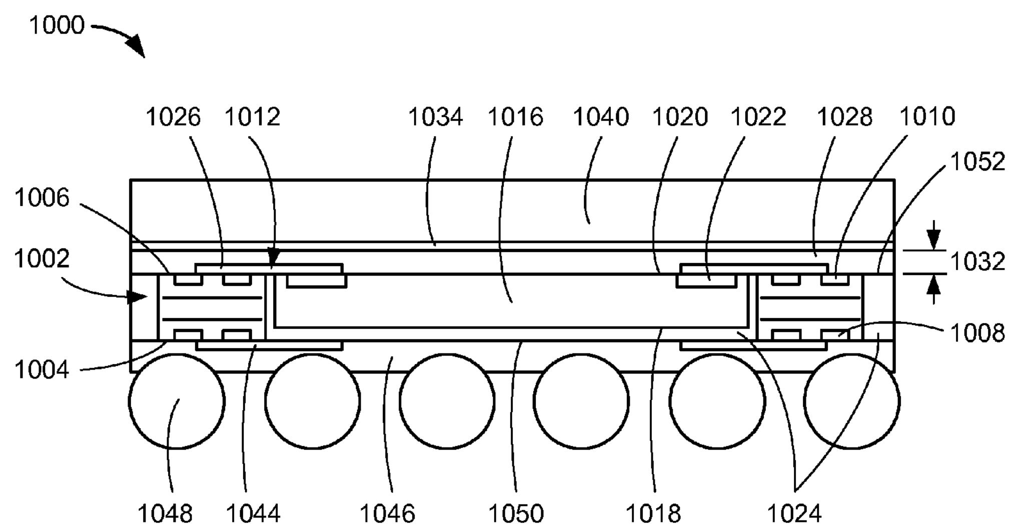
FIG. 10 is a cross-sectional view similar to FIG. 1 of an integrated circuit packaging system in a second embodiment of the present invention.

Referring now to FIG. 10, therein is shown a cross-sectional view similar to FIG. 1 of an integrated circuit packaging system 1000 in a second embodiment of the present invention. The integrated circuit packaging system 1000 can be formed in a manner similar to the integrated circuit packaging system 100 of FIG. 1, except for the formation of the top re-passivation layer 128 of FIG. 1, the thermal interface 134 of FIG. 1, and the heat sink 140 of FIG. 1.

The integrated circuit packaging system 1000 can include an interconnect structure 1002 having a structure bottom side 1004, a structure top side 1006, a structure bottom pad 1008, a structure top pad 1010, and a cavity 1012. The interconnect structure 1002 can be formed in a manner similar to the interconnect structure 102 of FIG. 1.

The integrated circuit packaging system 1000 can include an integrated circuit 1016 having an inactive side 1018, an active side 1020, and a device pad 1022. The integrated circuit packaging system 1000 can include an encapsulation 1024 and a top redistribution line 1026 (RDL). The integrated circuit 1016, the encapsulation 1024, and the top redistribution line 1026 can be formed in a manner similar to the integrated circuit 116 of FIG. 1, the encapsulation 124 of FIG. 1, and the top redistribution line 126 of FIG. 1, respectively.

A top re-passivation layer 1028 can be formed on the structure top side 1006, the encapsulation 1024, the active side 1020, and the top redistribution line 1026. The top re-passivation layer 1028 protects the structure top side 1006, the active side 1020, and the top redistribution line 1026 from contamination. The top re-passivation layer 1028 also electrically insulates the structure top side 1006, the encapsulation 1024, the active side 1020, and the top redistribution line 1026.

The top re-passivation layer 1028 can be deposited without a hole or an opening to save one mask layer. The top re-passivation layer 1028 can have a top re-passivation thickness 1032, which can preferably be in an approximate range of 0.1 micrometers (um) to 20 micrometers (um).

A thermal interface 1034 can be formed over the top re-passivation layer 1028. The thermal interface 1034 is a thermally conductive layer that provides heat transfer. The thermal interface 1034 can be directly on the top re-passivation layer 1028.

A heat sink 1040 can be mounted over the thermal interface 1034. The heat sink 1040 is a component or an assembly that transfers heat generated from the active side 1020 of the integrated circuit 1016. The heat sink 1040 can be directly on the thermal interface 1034. The heat sink 1040 can be over the active side 1020.

The integrated circuit packaging system 1000 can include a bottom redistribution line 1044 (RDL), a bottom re-passivation layer 1046, and an external connector 1048. The bottom redistribution line 1044, the bottom re-passivation layer 1046, and the external connector 1048 can be formed in a manner similar to the bottom redistribution line 144 of FIG. 1, the bottom re-passivation layer 146 of FIG. 1, and the external connector 148 of FIG. 1, respectively.

The encapsulation 1024 can include an encapsulation bottom side 1050 and an encapsulation top side 1052. The encapsulation 1024 can be formed in a manner similar to the encapsulation 124 of FIG. 1.

It has been discovered that the heat sink 1040, the thermal interface 1034, the top re-passivation layer 1028, and the active side 1020 of the integrated circuit 1016 are in direct contact resulting in significantly improved removal of heat from the integrated circuit 1016.

Figure 11:
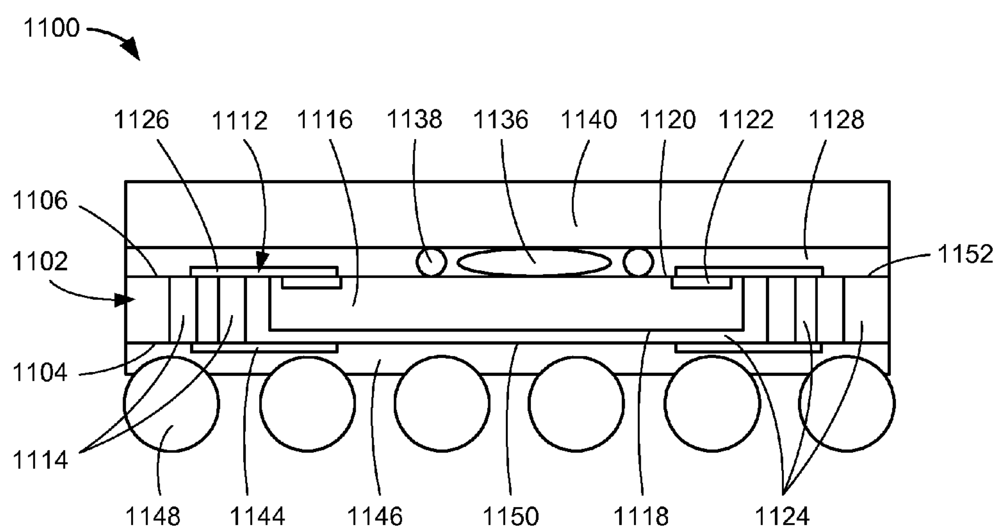
FIG. 11 is a cross-sectional view similar to FIG. 1 of an integrated circuit packaging system in a third embodiment of the present invention.

Referring now to FIG. 11, therein is shown a cross-sectional view similar to FIG. 1 of an integrated circuit packaging system 1100 in a third embodiment of the present invention. The integrated circuit packaging system 1100 can be formed in a manner similar to the integrated circuit packaging system 100 of FIG. 1, except for the formation of the interconnect structure 102 of FIG. 1, the encapsulation 124 of FIG. 1, the top redistribution line 126 of FIG. 1, the top re-passivation layer 128 of FIG. 1, the heat sink 140 of FIG. 1, the bottom redistribution line 144 of FIG. 1, and the bottom re-passivation layer 146 of FIG. 1. In addition, the integrated circuit packaging system 1100 can be formed in a manner similar to the integrated circuit packaging system 100 of FIG. 1, except for an addition of conductive connectors and without the thermal interface 134 of FIG. 1.

The integrated circuit packaging system 1100 can include an interconnect structure 1102, which provides a structure for connecting and mounting an electrical device therein. The interconnect structure 1102 can include a structure bottom side 1104 and a structure top side 1106 opposing the structure bottom side 1104. The interconnect structure 1102 can include a cavity 1112.

The interconnect structure 1102 can include a vertical interconnect 1114, which electrically connects the structure bottom side 1104 and the structure top side 1106. The vertical interconnect 1114 can be formed through the interconnect structure 1102 between the structure bottom side 1104 and the structure top side 1106. The structure bottom side 1104 and the structure top side 1106 can be electrically connected with the vertical interconnect 1114. The cavity 1112 can be formed through a plane of a top end of the vertical interconnect 1114 and a plane of a bottom end of the vertical interconnect 1114 in central portions of the planes of the top end and the bottom end of the interconnect structure 1102.

The vertical interconnect 1114 can be a conductive pillar, a conductive column, a conductive stud bump, a conductive ball, or a conductive plated via. The vertical interconnect 1114 can be formed with a conductive material including copper (Cu), gold (Au), solder, a metal, or a metallic alloy.

The vertical interconnect 1114 can be formed in multiple rows. The vertical interconnect 1114 can be formed in a peripheral array surrounding an integrated circuit 1116 having an inactive side 1118, an active side 1120, and a device pad 1122. The integrated circuit 1116 can be formed in a manner similar to the integrated circuit 116 of FIG. 1.

The top ends of the plurality of the vertical interconnect 1114 formed in rows or arrayed, define a plane of the structure top side 1106. Similarly, the bottom ends of the plurality of the vertical interconnect 1114 formed in rows or arrayed, define a plane of the structure bottom side 1104.

The integrated circuit 1116 can be mounted entirely within the cavity 1112. The vertical interconnect 1114 can be adjacent a non-horizontal side of the integrated circuit 1116.

The integrated circuit packaging system 1100 can include an encapsulation 1124, which covers a semiconductor package to seal electrical devices providing mechanical and environmental protection. The encapsulation 1124 can be a cover including an encapsulant or a mold material.

The encapsulation 1124 can partially cover the interconnect structure 1102 and the integrated circuit 1116. The encapsulation 1124 can be formed surrounding an external non-horizontal surface of the vertical interconnect 1114. The encapsulation 1124 can isolate the vertical interconnect 1114 and another of the vertical interconnect 1114. The encapsulation 1124 can be formed surrounding the inactive side 1118 and non-horizontal sides of the integrated circuit 1116.

A top redistribution line 1126 (RDL) can be formed directly on the active side 1120. The top redistribution line 1126 electrically connects the vertical interconnect 1114 at the structure top side 1106 and the device pad 1122. The top redistribution line 1126 can route electrical connection between the device pad 1122 and the vertical interconnect 1114.

A top re-passivation layer 1128 can be formed on the structure top side 1106, the top planar surface of the encapsulation 1124, the active side 1120, and the top redistribution line 1126. The top re-passivation layer 1128 protects the structure top side 1106, the active side 1120, and the top redistribution line 1126 from contamination. The top re-passivation layer 1128 also electrically insulates the structure top side 1106, the top planar surface of the encapsulation 1124, the active side 1120, and the top redistribution line 1126.

The top re-passivation layer 1128 can include a hole exposing a portion of the active side 1120. A first conductive connector 1136 can attached to the active side 1120 within the hole. A second conductive connector 1138 can be attached to the active side 1120 within another of the hole. For example, the first conductive connector 1136 and the second conductive connector 1138 can be thermally conductive connectors including thermal solder bumps.

The first conductive connector 1136 and the second conductive connector 1138 can be connected to bump pads formed on the active side 1120. The bump pads are contacts pads that provide electrical connectivity. For example, the bump pads can be contacts pads including solder bump pads.

The first conductive connector 1136 and the second conductive connector 1138 provide connectivity between the active side 1120 and a heat sink 1140, which is a component or an assembly that transfers heat generated from the active side 1120 of the integrated circuit 1116. Instead of using a thermal interface material (TIM), the first conductive connector 1136 and the second conductive connector 1138 can be used to contact the heat sink 1140 and the bump pads. Top portions of the first conductive connector 1136 and the second conductive connector 1138 can be exposed from the top re-passivation layer 1128 such that the first conductive connector 1136 and the second conductive connector 1138 can be attached to the heat sink 1140.

For illustrative purposes, the first conductive connector 1136 is shown having a shape of an oval, although it is understood that the first conductive connector 1136 can have any shape. Also for illustrative purposes, the second conductive connector 1138 is shown having a shape of a circle, although it is understood that the second conductive connector 1138 can have any shape.

The heat sink 1140 can be mounted directly on the top re-passivation layer 1128. The heat sink 1140 can be over the active side 1120. The heat sink 1140 can be mounted directly on the top portions of the first conductive connector 1136 and the second conductive connector 1138. The heat sink 1140 can be thermally connected to the active side 1120 with the first conductive connector 1136 and the second conductive connector 1138.

A bottom redistribution line 1144 (RDL) can be formed directly on the structure bottom side 1104. The bottom redistribution line 1144 electrically connects the vertical interconnect 1114 to provide connectivity to an electrical connector. The bottom redistribution line 1144 can route electrical connection between the electrical connector and the vertical interconnect 1114.

Instead of a printed circuit board (PCB), the interconnect structure 1102 can include the vertical interconnect 1114. The vertical interconnect 1114 can be used to electrically interconnect the top redistribution line 1126 and the bottom redistribution line 1144.

A bottom re-passivation layer 1146 can be formed on the structure bottom side 1104, the bottom planar surface of the encapsulation 1124, and the bottom redistribution line 1144. The bottom re-passivation layer 1146 protects the structure bottom side 1104 and the bottom redistribution line 1144 from contamination. The bottom re-passivation layer 1146 also electrically insulates the structure bottom side 1104, the bottom planar surface of the encapsulation 1124, and the bottom redistribution line 1144.

The integrated circuit packaging system 1100 can include an external connector 1148. The external connector 1148 can be formed in a manner similar to the external connector 148 of FIG. 1.

The plane of the structure bottom side 1104 can be coplanar with a plane of an encapsulation bottom side 1150 of the encapsulation 1124. A plane of an encapsulation top side 1152 of the encapsulation 1124 and planes of the structure top side 1106 and the active side 1120 can be coplanar with each other.

It has been discovered that the first conductive connector 1136 and the second conductive connector 1138 directly connected to the heat sink 1140 results in significant removal of heat from the active side 1120 of the integrated circuit 1116.

It has been unexpectedly found that the first conductive connector 1136 and the second conductive connector 1138 provide significant heat transfer from the active side 1120 to the heat sink 1140.

Figure 12:
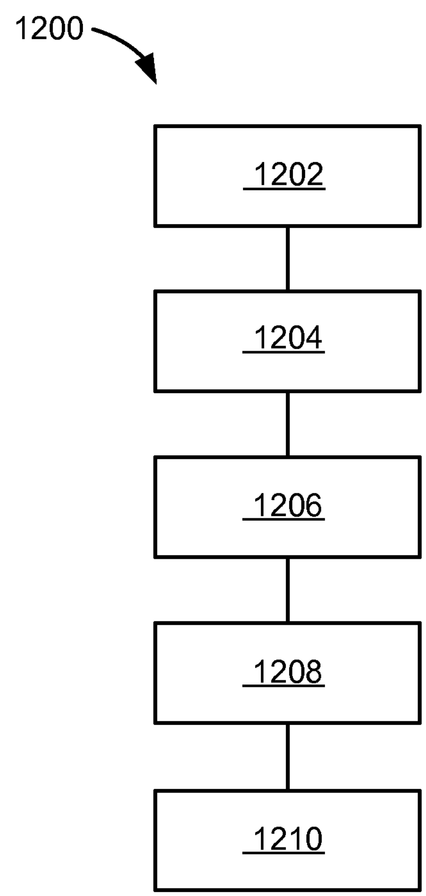
FIG. 12 is a flow chart of a method of manufacture of an integrated circuit packaging system in a further embodiment of the present invention.

Referring now to FIG. 12, therein is shown a flow chart of a method 1200 of manufacture of the integrated circuit packaging system 100 in a further embodiment of the present invention. The method 1200 includes: providing an interconnect structure having a structure bottom side, a structure top side, and a cavity, the structure bottom side electrically connected to the structure top side in a block 1202; mounting an integrated circuit entirely within the cavity, the integrated circuit having an active side coplanar with the structure top side in a block 1204; forming an encapsulation partially covering the interconnect structure and the integrated circuit, the encapsulation having an encapsulation top side coplanar with the structure top side and the active side in a block 1206; forming a top re-passivation layer over the structure top side and the encapsulation in a block 1208; and mounting a heat sink over the top re-passivation layer for removing heat from the active side in a block 1210.

Thus, it has been discovered that the integrated circuit packaging system of the present invention furnishes important and heretofore unknown and unavailable solutions, capabilities, and functional aspects for heat removal. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:

providing an interconnect structure having a structure bottom side, a structure top side, and a cavity, the structure bottom side electrically connected to the structure top side;

mounting an integrated circuit entirely within the cavity, the integrated circuit having an active side coplanar with the structure top side;

forming an encapsulation partially covering the interconnect structure and the integrated circuit, the encapsulation having an encapsulation top side coplanar with the structure top side and the active side;

forming a top re-passivation layer over the structure top side and the encapsulation, the top re-passivation layer having a hole; and mounting a heat sink over the top re-passivation layer for removing heat from the active side, the heat sink having a protrusion on the active side and within the hole.

2. The method as claimed in claim 1 wherein mounting the heat sink includes mounting the heat sink, the heat sink larger than the integrated circuit.

3. The method as claimed in claim 1 wherein:

mounting the heat sink includes mounting the heat sink connected to the structure top side; and further comprising:

connecting an external connector to the structure bottom side, the heat sink grounded through the external connector.

4. The method as claimed in claim 1 wherein mounting the heat sink includes mounting the heat sink having a protrusion on the active side.

5. A method of manufacture of an integrated circuit packaging system comprising:

providing an interconnect structure having a structure bottom side, a structure top side, and a cavity, the structure bottom side electrically connected to the structure top side;

mounting an integrated circuit entirely within the cavity, the integrated circuit having an active side coplanar with the structure top side;

forming an encapsulation partially covering the interconnect structure and the integrated circuit, the encapsulation having an encapsulation top side coplanar with the structure top side and the active side;

forming a top redistribution line electrically connected to the structure top side and the active side;

forming a top re-passivation layer over the structure top side and the encapsulation, the top re-passivation layer directly on the top redistribution line; and mounting a heat sink over the top re-passivation layer for removing heat from the active side.

6. The method as claimed in claim 5 further comprising:

forming a thermal interface directly on the active side; and wherein:

mounting the heat sink includes mounting the heat sink directly on the thermal interface.

7. The method as claimed in claim 5 further comprising:

forming a thermal interface directly on the top re-passivation layer; and wherein:

mounting the heat sink includes mounting the heat sink directly on the thermal interface.

8. The method as claimed in claim 5 further comprising:

attaching a conductive connector to the active side; and wherein:

mounting the heat sink includes mounting the heat sink directly on the conductive connector.

9. The method as claimed in claim 5 wherein providing the interconnect structure includes providing the interconnect structure having a vertical interconnect between the structure bottom side and the structure top side.

10. An integrated circuit packaging system comprising:

an interconnect structure having a structure bottom side, a structure top side, and a cavity, the structure bottom side electrically connected to the structure top side;

an integrated circuit entirely within the cavity, the integrated circuit having an active side coplanar with the structure top side;

an encapsulation partially covering the interconnect structure and the integrated circuit, the encapsulation having an encapsulation top side coplanar with the structure top side and the active side;

a top re-passivation layer over the structure top side and the encapsulation, the top re-passivation layer having a hole; and a heat sink over the top re-passivation layer for removing heat from the active side, the heat sink having a protrusion on the active side and within the hole.

11. The system as claimed in claim 10 wherein the heat sink is larger than the integrated circuit.

12. The system as claimed in claim 10 wherein:

the heat sink is connected to the structure top side; and further comprising:

an external connector connected to the structure bottom side, the heat sink grounded through the external connector.

13. The system as claimed in claim 10 wherein the heat sink has a protrusion on the active side.

14. The system as claimed in claim 10 further comprising:

a top redistribution line electrically connected to the structure top side and the active side; and wherein:

the top re-passivation layer is directly on the top redistribution line.

15. The system as claimed in claim 14 further comprising:

a thermal interface directly on the active side; and wherein:

the heat sink is directly on the thermal interface.

16. The system as claimed in claim 14 further comprising:

a thermal interface directly on the top re-passivation layer; and wherein:

the heat sink is directly on the thermal interface.

17. The system as claimed in claim 14 further comprising:

a conductive connector attached to the active side; and wherein:

the heat sink is directly on the conductive connector.

18. The system as claimed in claim 14 wherein the interconnect structure has a vertical interconnect between the structure bottom side and the structure top side.

* * * * *